(12) United States Patent
Fan et al.

(10) Patent No.: US 9,455,303 B2
(45) Date of Patent: Sep. 27, 2016

(54) WHITE ORGANIC LIGHT EMITTING DEVICE

(71) Applicants: Shanghai Tianma AM-OLED Co., Ltd., Shanghai (CN); Tianma Micro-Electronics Co., Ltd., Shenzhen (CN)

(72) Inventors: Liujing Fan, Shanghai (CN); Liyuan Luo, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/601,181

(22) Filed: Jan. 20, 2015

(65) Prior Publication Data

US 2015/0380468 A1    Dec. 31, 2015

(30) Foreign Application Priority Data

Jun. 30, 2014 (CN) .......................... 2014 1 0307561

(51) Int. Cl.
*H01L 27/32* (2006.01)
*H01L 51/52* (2006.01)

(52) U.S. Cl.
CPC ....... *H01L 27/3202* (2013.01); *H01L 27/3211* (2013.01); *H01L 51/5265* (2013.01); *H01L 2251/5361* (2013.01)

(58) Field of Classification Search
CPC .......................... H01L 27/3211; H01L 51/5265
See application file for complete search history.

(56) References Cited

U.S. PATENT DOCUMENTS

| | | | |
|---|---|---|---|
| 8,294,161 B2 * | 10/2012 | Hunze | H01L 51/5036 257/40 |
| 2004/0238856 A1 * | 12/2004 | Mkel | B29C 51/10 257/222 |
| 2006/0214573 A1 | 9/2006 | Maeda et al. | |
| 2007/0145349 A1 | 6/2007 | Lu et al. | |
| 2007/0286944 A1 | 12/2007 | Yokoyama et al. | |
| 2008/0111474 A1 | 5/2008 | Sung et al. | |
| 2009/0085478 A1 | 4/2009 | Cok et al. | |

(Continued)

FOREIGN PATENT DOCUMENTS

| | | |
|---|---|---|
| CN | 1838427 A | 9/2006 |
| CN | 201112424 Y | 9/2008 |

(Continued)

OTHER PUBLICATIONS

1st Office Action as received in corresponding Chinese Application No. 201410307561.6 dated Jan. 25, 2016.
2nd Office Action as received in corresponding Chinese Application No. 201410307561.6, dated Jul. 12, 2016.

*Primary Examiner* — Lex Malsawma
*Assistant Examiner* — Xia L Cross
(74) *Attorney, Agent, or Firm* — Alston & Bird LLP (57) ABSTRACT

A white organic light emitting device is disclosed. The device includes a first light emitting unit, which has first, second, and third light emitting element. The first light emitting element includes a blue light emitting material, the second light emitting element includes a yellow light emitting material, and the third light emitting element includes a yellow light emitting material. In addition, the first light emitting unit, the second light emitting unit and the third light emitting unit are arranged in parallel.

10 Claims, 4 Drawing Sheets

(56) References Cited

U.S. PATENT DOCUMENTS

| | | | |
|---|---|---|---|
| 2009/0096359 A1* | 4/2009 | Lee | H01L 51/5265 313/504 |
| 2011/0284828 A1* | 11/2011 | Kai | C07F 9/582 257/40 |
| 2014/0110682 A1* | 4/2014 | Shih | H01L 51/5265 257/40 |
| 2014/0374715 A1* | 12/2014 | Lee | H01L 51/0004 257/40 |
| 2015/0008398 A1* | 1/2015 | Lee | H01L 51/5212 257/40 |
| 2015/0243912 A1* | 8/2015 | Strassner | H01L 51/0087 252/519.2 |

FOREIGN PATENT DOCUMENTS

| | | |
|---|---|---|
| CN | 101331800 A | 12/2008 |
| CN | 101409330 A | 4/2009 |
| CN | 101821872 A | 9/2010 |
| CN | 103123926 A | 5/2013 |
| CN | 103165821 A | 6/2013 |
| CN | 103647026 A | 3/2014 |

* cited by examiner

WHITE ORGANIC LIGHT EMITTING DEVICE

This application claims the benefit of priority to Chinese Patent Application No. 201410307561.6, filed with the Chinese Patent Office on Jun. 30, 2014 and entitled "WHITE ORGANIC LIGHT EMITTING DEVICE, the content of which is incorporated herein by reference in its entirety.

FIELD OF THE INVENTION

The disclosure relates to the field of organic light emitting technology, and in particular to a white organic light emitting device with a wider range for adjusting color temperature.

BACKGROUND OF THE INVENTION

A white organic light emitting device is capable of generating efficient and saturated white light and has features such as a low driven voltage, good flexibility of material, and a large area for display. Therefore, the white organic light emitting device has a great application potential in fields such as information display and solid state lighting. However, factors such as high production cost and unstable performance restrict industrialization process of the white organic light emitting device. From a view of device structure, the white organic light emitting device is mainly classified as a single-layer light emitting structure and a multilayer light emitting structure. A disadvantage of a device with the single-layer light emitting structure is low light emitting efficiency. A device with the multilayer light emitting structure is used to generate white light by complementary color layers (such as a blue light layer and a yellow-orange light layer), or implement white light emission by multiple light emitting layers of three primary colors of red, green and blue. The multilayer light emitting structure has a better performance and ideal white light can be obtained by controlling each light emitting layer, but the light emitting layers may have different light emitting efficiency due to different driven voltages and may have different operating lives, which may affect chromaticity coordinates and stability.

The ideal white light is implemented by mixing the three primary colors of red, green and blue, and a waveband of the emitted light of materials should cover the whole visible light region, so that full spectrum emission can be acquired, and light emitted by a prepared device has a saturated color and a high color rendition index (CRI).

Performance of the organic light emitting device is related to the material and may also be adjusted by changing the structure of the light emitting diode. A Fabry-Perot (F-P) optical microcavity effect of the organic light emitting device causes an increase of intensity of an emission peak at a certain wavelength and a narrowed band, and tunability of the wavelength and color display can be achieved. The organic light emitting diode having the microcavity effect has a structure capable of selecting an optical mode by a microcavity, therefore narrowband emission of a particular wavelength can be achieved.

The organic light emitting diode is formed by an anode, a cathode and an organic layer which includes a light emitting layer. To improve transportation and balance of electrons or holes, the organic light emitting diode usually includes an electronic (hole) transport layer and an electron (hole) injection layer. In preparing the light emitting diode with the microcavity structure, a reasonable design for an optical length of the cavity is required, and a resonant cavity with reflectors in which light is reflected back and forth is also required, where one of the reflectors is usually formed by a metal electrode of the organic light emitting diode.

BRIEF SUMMARY OF THE INVENTION

One inventive aspect is a white organic light emitting device. The device includes a first light emitting unit, which has first, second, and third light emitting element. The first light emitting element includes a blue light emitting material, the second light emitting element includes a yellow light emitting material, and the third light emitting element includes a yellow light emitting material. In addition, the first light emitting unit, the second light emitting unit and the third light emitting unit are arranged in parallel.

DETAILED DESCRIPTION OF THE INVENTION

For better understanding of the technical content of the present disclosure, the technical content is described below by embodiments of the disclosure in conjunction with the drawings. The drawings and the embodiments are not limitations of the disclosure, and persons of ordinary skill in the art can make some modifications and improvements within the principle of the disclosure, therefore scope of the disclosure should be subjected to the scope limited by the claims.

Figure 1A:
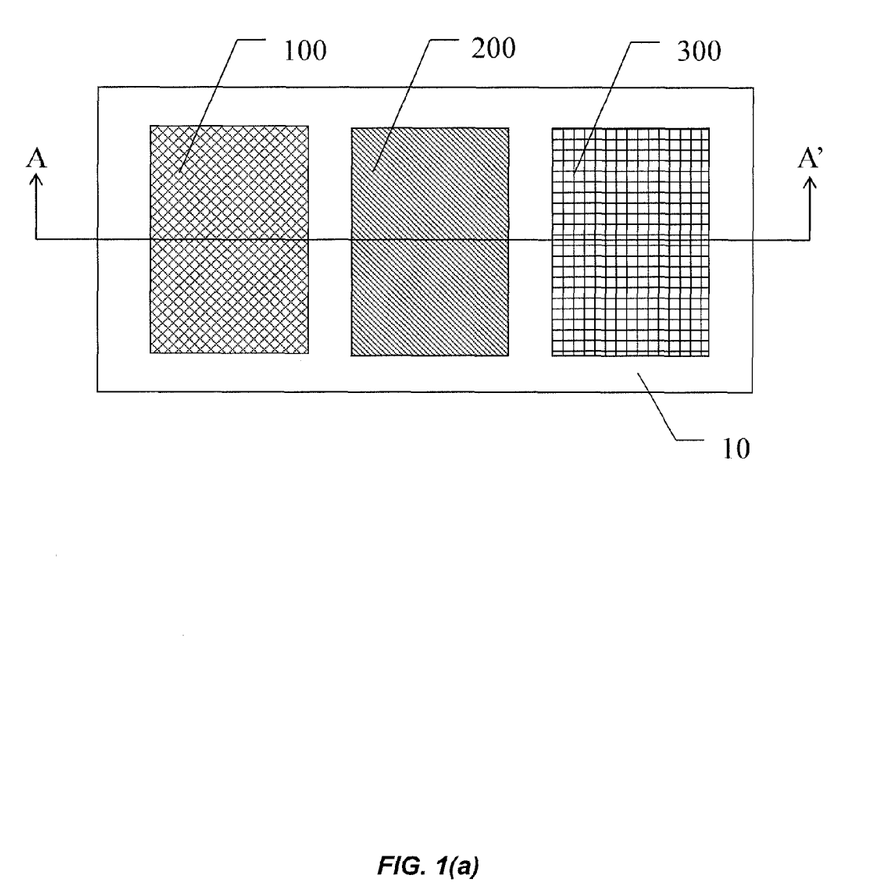
FIG. 1(a) is a schematic plan view of a white organic light emitting device according to an embodiment of the disclosure.
Figure 1B:
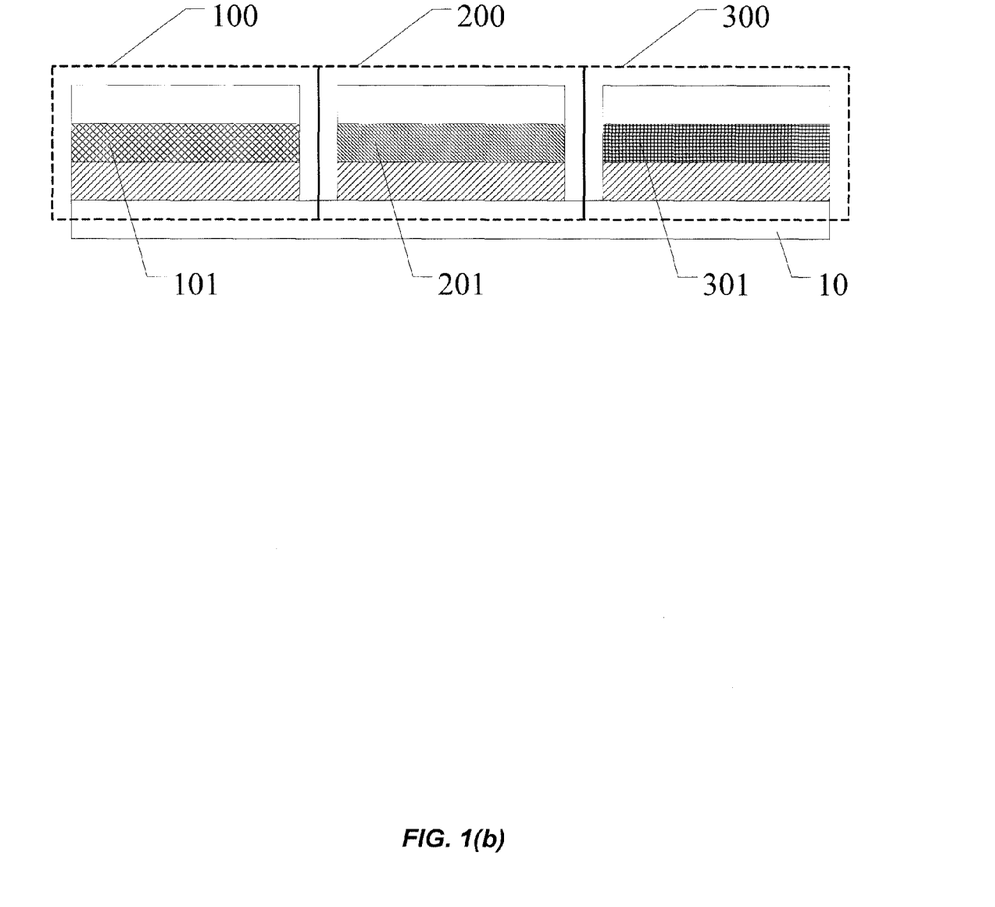
FIG. 1(b) is a schematic sectional view of a white organic light emitting device according to an embodiment of the disclosure.

FIG. 1(a) is a schematic plan view of a white organic light emitting device according to an embodiment of the disclosure. FIG. 1(b) is a schematic sectional view of a white organic light emitting device according to an embodiment of the disclosure. Referring to FIG. 1(a) and FIG. 1(b), the white organic light emitting device according to the embodiment of the disclosure includes: a substrate 10, a first light emitting unit 100, a second light emitting unit 200 and a third light emitting unit 300. The first light emitting unit 100, the second light emitting unit 200 and the third light emitting unit 300 are arranged in parallel on the substrate 10. The first light emitting unit 100 includes a first light emitting element 101, the second light emitting unit 200 includes a second light emitting element 201, and the third light emitting unit 300 includes a third light emitting element 301.

The light emitting units of the white organic light emitting device according to the embodiment of the disclosure are arranged in parallel on the substrate, which can ensure stabilities of voltages for the light emitting units, so that each light emitting unit has more stable light emitting efficiency, and thus performances such as color stability and color purity of light emitted by the light-emitting device are better.

White light of the white organic light emitting device may be achieved by mixing complementary colors, therefore, the first light emitting element may include blue light emitting material, and the second light emitting element and the third light emitting element include yellow light emitting material. The blue light emitting material may be phosphorescence blue light emitting material FIr6(FIrpic):mCP, i.e., Bis[2-(4,6-difluorophenyl)pyridinato-C2, N](picolinato) iridium(III): 1,3-Di-9-carbazolylbenzene. The yellow light emitting material may be phosphorescence yellow light emitting material Ir(2-phq)2(acac):CBP, i.e., Tris(2-phenylquinoline-C2, N')iridium(III): 4,4'-Bis(N-carbazolyl)-1, 1'-biphenyl. A peak position of an intrinsic emission spectrum of the blue light emitting material ranges from 430 nm to 480 nm, and a peak position of an intrinsic emission spectrum of the yellow light emitting material ranges from 560 nm to 600 nm. Furthermore, for convenience of manufacture process, the second light emitting element and the third light emitting element may include the same yellow light emitting material.

Light emitting efficiency of the yellow light emitting material is high, therefore, light emitting efficiency of the white organic light emitting device can be improved by using complementation of blue light and yellow light to implement emission of the white light.

In a case that the first light emitting element uses the blue light emitting material, and the second light emitting element and the third light emitting element use the yellow light emitting material, structures of the light emitting units may be further improved to obtain white light by mixing three primary colors of red, green and blue. A preferred embodiment is described in detail below in terms of the structure of the light emitting unit.

Figure 2:
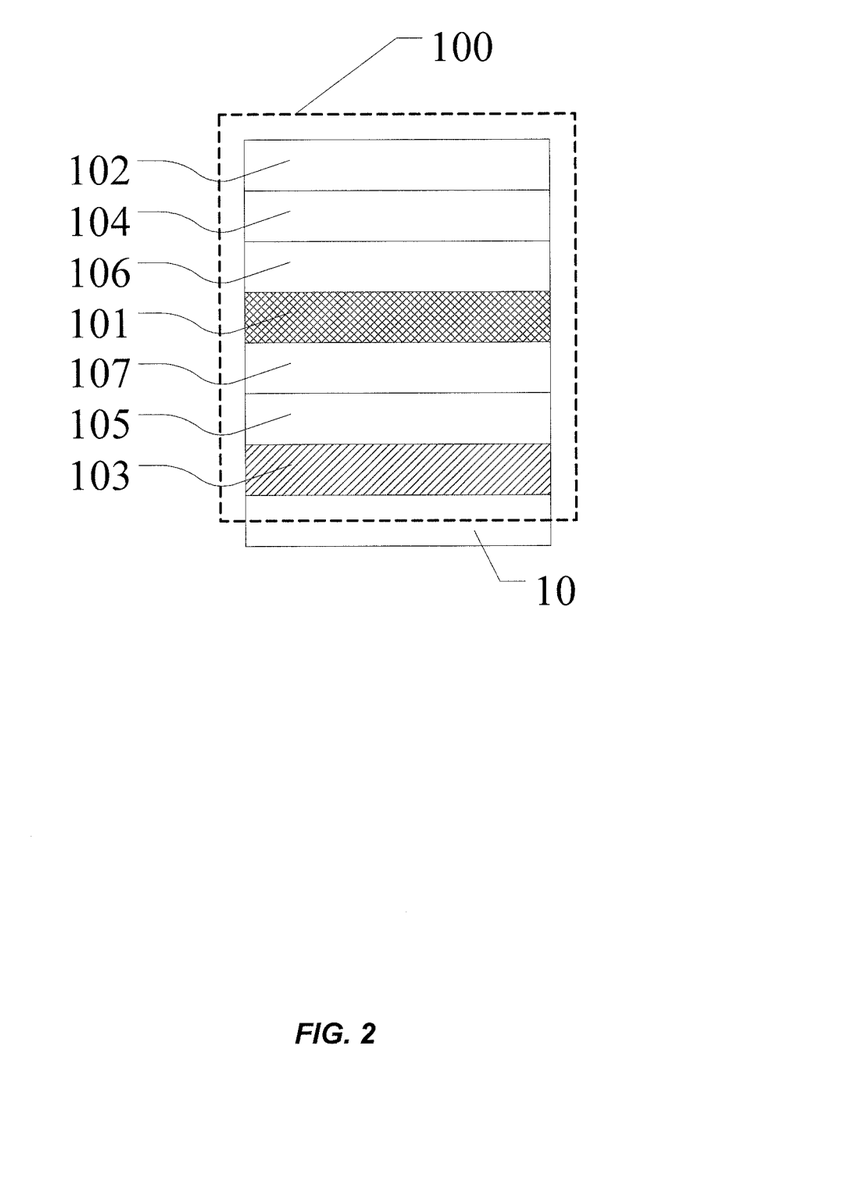
FIG. 2 is a schematic sectional view of a first light emitting unit of a white organic light emitting device according to a preferred embodiment of the disclosure.

FIG. 2 is a schematic sectional view of a first light emitting unit of a white organic light emitting device according to the preferred embodiment of the disclosure. Referring to FIG. 2, the first light emitting unit 100 includes a cathode 102 and an anode 103, and the first light emitting element 101 is arranged between the cathode 102 and the anode 103. The first light emitting unit may further include a hole injection layer 104, a hole transport layer 106, an electron injection layer 105 and an electron transport layer 107. These layers can improve transportation and balance of electrons or holes.

By designing the structure of the light emitting unit, tunability of a wavelength can be implemented by using an optical microcavity. To form the optical microcavity in the light emitting unit, a resonant cavity with reflectors in which light is reflected back and forth is required. The reflectors of the resonant cavity of the first light emitting unit 100 are achieved by reflective surfaces of the cathode 102 and the anode 103. Therefore, the anode 103 includes conductive material having reflection characteristic. The anode 103 may have a structure of single-layer conductive material, and the conductive material may be metal such as silver, gold, nickel or platinum, or may be transparent conductive oxide such as ITO or ZnO. Alternatively, the anode 103 may have a multilayer structure such as Al/ITO, Ag/ITO, Al/Ni or Al/Pt. Regardless of the single-layer structure or the multilayer structure of the anode 103, in a case that the anode 103 includes a metal layer, the reflective surface of the anode 103 is a metal layer of the anode 103 which is closest to the first light emitting element 101; in a case that the anode 103 only includes transparent conductive material, the reflective surface of the anode 103 is a layer of the anode 103 which is closest to the first light emitting element 101, and the reflective surface of the anode 103 forms a reflector of the resonant cavity. Similarly, the cathode 102 includes conductive material having reflection characteristic. The cathode 102 may be made of magnesium silver alloy or lithium aluminum alloy, or may be made of transparent conductive material such as ITO. Similarly, the cathode 102 may have a single-layer structure or a multilayer structure. In a case that the cathode 102 includes a metal layer, the reflective surface of the cathode 102 is a metal layer of the cathode 102 which is closest to the first light emitting element 101; in a case that the cathode 102 only includes transparent conductive material, the reflective surface of the cathode 102 is a layer of the cathode 102 which is closest to the first light emitting element 101, and the reflective surface of the cathode 102 forms another reflector of the resonant cavity. In a top-emission organic light emitting device, an anode usually includes metal conductive material and has a good reflection performance, and a cathode is usually made of transparent conductive material to ensure light transmission and has a half-reflection performance.

The reflective surfaces of the cathode 102 and the anode 103 of the first light emitting unit 100 form the resonant cavity with reflectors of the first light emitting unit 100, i.e., an optical microcavity. Before describing the structure of the optical microcavity of the first light emitting unit 100, an optical length of the optical microcavity is described.

An optical length L of the optical microcavity is calculated by the following formula (1):

$$L = \frac{\lambda}{2}\left(\frac{n_{eff}}{\Delta n}\right) + \sum_i n_i d_i + \left|\frac{\Phi_m \lambda}{4\pi}\right| \qquad (1)$$

where $\lambda$ is a wavelength in free space, $n_{eff}$ is an effective refractive index of distributed Bragg reflectors (DBR), $\Delta n$ is a difference between a high refraction index and a low refraction index of DBR, $n_i$ and $d_i$ are respectively a refractive index and a thickness of an ith layer in the optical microcavity, and $\Phi_m$ is a phase shift of the metal reflector. The first item of the formula of the optical length represents an effective tunneling depth of light relative to DBR, the second item of the formula represents a total optical thickness of the optical microcavity, and the third item of the formula represents an optical length caused by a phase shift of the light relative to the metal reflector. Compared with a value of the second item, values of the first item and the third item are very small, therefore, the first item and the third item may not be considered in designing the structure of the optical microcavity in practice.

Therefore, in designing the optical length of the optical microcavity of the light emitting unit, the following formula (2) is referred to:

$$L = \sum_i n_i d_i \qquad (2)$$

In a case that the light wavelength satisfies the following formula (3), an optical resonant mode of the cavity is achieved:

$$m\frac{\lambda_m}{2} = L \qquad (3)$$

where m is a positive integer, $\lambda_m$ is a peak wavelength of light emission for the microcavity, and $\lambda_m$ is within a range of an emission spectrum of the light emitting unit without a microcavity, and L is an optical length of the optical microcavity. It can be seen from the formula (3) that since the wavelength satisfying resonance is not the same as a peak wavelength of the organic light emitting unit without a microcavity, the peak may shift. For optical microcavities with different structures, the optical length may be determined by proper items, and the emission wavelength of the light emitting unit with an optical microcavity is finally determined by the formula (2) and the formula (3).

The formula (2) and the formula (3) may be combined into the following formula (4):

$$\sum_i n_i d_i = \frac{\lambda_m}{2} m \quad (4)$$

By designing a proper optical length of the optical microcavity, the peak wavelength of the light emission from the optical microcavity may shift within a range of the emission spectrum of the organic light emitting unit without an optical microcavity.

In a preferred embodiment of the disclosure, the first light emitting unit 100 is designed to emit blue light, and the peak wavelength of the light emission from the first light emitting unit 100 is in a wavelength range of the blue light, i.e., a range from 430 nm to 480 nm.

The optical microcavity is formed between reflective surfaces of the anode 103 and the cathode 102 of the first light emitting unit 100, and the optical microcavity of the first light emitting unit 100 satisfies the following formula (5):

$$\sum_i n_{Bi} d_{Bi} = \frac{\lambda_B}{2} m_B \quad (5)$$

where $n_{Bi}$ is a refractive index of an ith layer in the optical microcavity of the first light emitting unit 100, $d_{Bi}$ is a thickness of the ith layer in the optical microcavity of the first light emitting unit 100, $\lambda_B$ is a wavelength of the blue light predetermined to be emitted by the first light emitting unit 100, and $m_B$ is a modulus of the optical microcavity of the first light emitting unit 100, which is a positive integer.

The optical microcavity of the first light emitting unit 100 includes the first light emitting element 101, and may also include the hole injection layer 104, the hole transport layer 106, the electron injection layer 105 and the electron transport layer 107. In addition, if a transparent conductive layer is arranged on the reflective surface of the cathode 102 which is close to the first light emitting element 101, or if a transparent conductive layer is arranged on the reflective surface of the anode 103 which is close to the first light emitting element 101, the thickness of the transparent conductive layer is included in the optical length of the optical microcavity.

In addition, it can be known from the optical resonance formula (3) that the peak wavelength of light emission from the microcavity should be in a range of the emission spectrum of the first light emitting unit 100 without a microcavity, therefore $\lambda_B$ in the formula (5) is in a wavelength range of an intrinsic emission spectrum of the first light emitting element 101.

$m_B$ is a modulus of the optical microcavity of the first light emitting unit 100, which is a positive integer. Theoretically, $m_B$ may be any integer, and may be selected by overall consideration in view of process, device life, efficiency and device performance, which is not described in detail herein.

The structure of the second light emitting unit is similar to the structure of the first light emitting unit. An optical microcavity is formed between reflective surfaces of an anode and a cathode of the second light emitting unit. The second light emitting unit differs from the first light emitting unit in that, the second light emitting unit is designed to emit green light, that is, a peak wavelength of light emission of the second light emitting unit is in a range from 500 nm to 560 nm, according to a preferred embodiment of the disclosure. Light intrinsically emitted by the second light emitting element is yellow light, that is, the light emitted by the second light emitting element without a microcavity is the yellow light. Since wavelengths of green light and red light exist in the spectrum range of the yellow light, a proper optical microcavity may be designed to make a peak wavelength of the yellow light emitted by the second light emitting element have a blue shift and the peak wavelength of the light finally emitted by the second light emitting unit be in a wavelength range of the green light. The optical microcavity of the second light emitting unit satisfies the following formula (6):

$$\sum_i n_{Gi} d_{Gi} = \frac{\lambda_G}{2} m_G \quad (6)$$

where $n_{Gi}$ is a refractive index of an ith layer in the optical microcavity of the second light emitting unit, $d_{Gi}$ is a thickness of the ith layer in the optical microcavity of the second light emitting unit, $\lambda_G$ is a wavelength of the green light predetermined to be emitted by the second light emitting unit, and $m_G$ is a modulus of the optical microcavity of the second light emitting unit, which is a positive integer.

Similarly, the optical microcavity of the second light emitting unit includes the second light emitting element, and may also include a hole injection layer, a hole transport layer, an electron injection layer and an electron transport layer. In addition, if a transparent conductive layer is arranged on a reflective surface of the cathode which is close to the second light emitting element, or if a transparent conductive layer is arranged on a reflective surface of the anode which is close to the second light emitting element, the thickness of the transparent conductive layer is included in the optical length of the optical microcavity.

In addition, it can be known from the optical resonance formula (3) that the peak wavelength of light emission from the microcavity should be in a range of a emission spectrum of the second light emitting unit without a microcavity, therefore, $\lambda_G$ in formula (6) is in a wavelength range of an intrinsic emission spectrum of the second light emitting element.

$m_G$ is a modulus of the optical microcavity of the second light emitting unit, which is a positive integer. Theoretically, $m_G$ may be any integer, and may be selected by overall consideration in view of process, device life, efficiency and device performance, which is not described in detail herein.

The structure of the third light emitting unit is also similar to the structure of the first light emitting unit. An optical microcavity is formed between reflective surfaces of an anode and a cathode of the third light emitting unit. The third light emitting unit differs from the first light emitting unit in that, the third light emitting unit is designed to emit red light, that is, a peak wavelength of light emission of the third light emitting unit is in a range from 600 nm to 650 nm, according to a preferred embodiment of the disclosure. Light intrinsically emitted by the third light emitting element is yellow light, that is, the light emitted by the third light emitting element without a microcavity is the yellow light. Since wavelengths of green light and red light exist in a spectrum range of the yellow light, a proper optical microcavity may be designed to make a peak wavelength of the yellow light emitted by the third light emitting element have a red shift and the peak wavelength of the light finally emitted by the third light emitting unit be in a wavelength range of the red light. The optical microcavity of the third light emitting unit satisfies the following formula (7):

$$\sum_i n_{Ri} d_{Ri} = \frac{\lambda_R}{2} m_R \qquad (7)$$

where $n_{Ri}$ is a refractive index of an ith layer in the optical microcavity of the third light emitting unit, $d_{Ri}$ is a thickness of the ith layer in the optical microcavity of the third light emitting unit, $\lambda_R$ is a wavelength of the red light predetermined to be emitted by the third light emitting unit, and $m_R$ is a modulus of the optical microcavity of the third light emitting unit, which is a positive integer.

Similarly, the optical microcavity of the third light emitting unit includes the third light emitting element, and may also include a hole injection layer, a hole transport layer, an electron injection layer and an electron transport layer. In addition, if a transparent conductive layer is arranged on a reflective surface of the cathode which is close to the third light emitting element, or if a transparent conductive layer is arranged on a reflective surface of the anode which is close to the third light emitting element, the thickness of the transparent conductive layer is included in the optical length of the optical microcavity.

In addition, it can be known from the optical resonance formula (3) that a peak wavelength of light emission from the microcavity should be in a range of an emission spectrum of the third light emitting unit without a microcavity, therefore, $\lambda_R$ in the formula (7) is in a wavelength range of an intrinsic emission spectrum of the third light emitting element.

$m_R$ is a modulus of the optical microcavity of the third light emitting unit, which is a positive integer. Theoretically, $m_R$ may be any integer, and may be selected by overall consideration in view of process, device life, efficiency and device performance, which is not described in detail herein.

By adjusting the structure of each light emitting unit, white light is obtained by mixture of three primary colors of red, green and blue in the preferred embodiment of the disclosure. In this way, full spectrum emission is achieved, and light emitted by a prepared white organic light emitting device has a saturated color and a high CRI. In addition, since light emitting efficiency of yellow light emitting material is high, white light is obtained by mixing three primary colors of red, green and blue for the white organic light emitting device according to the preferred embodiment of the disclosure, with high light emitting efficiency being kept. In addition, degree for adjusting ratios of the primary colors is greater, and the color temperature of the white light obtained has a wider range.

Figure 3:
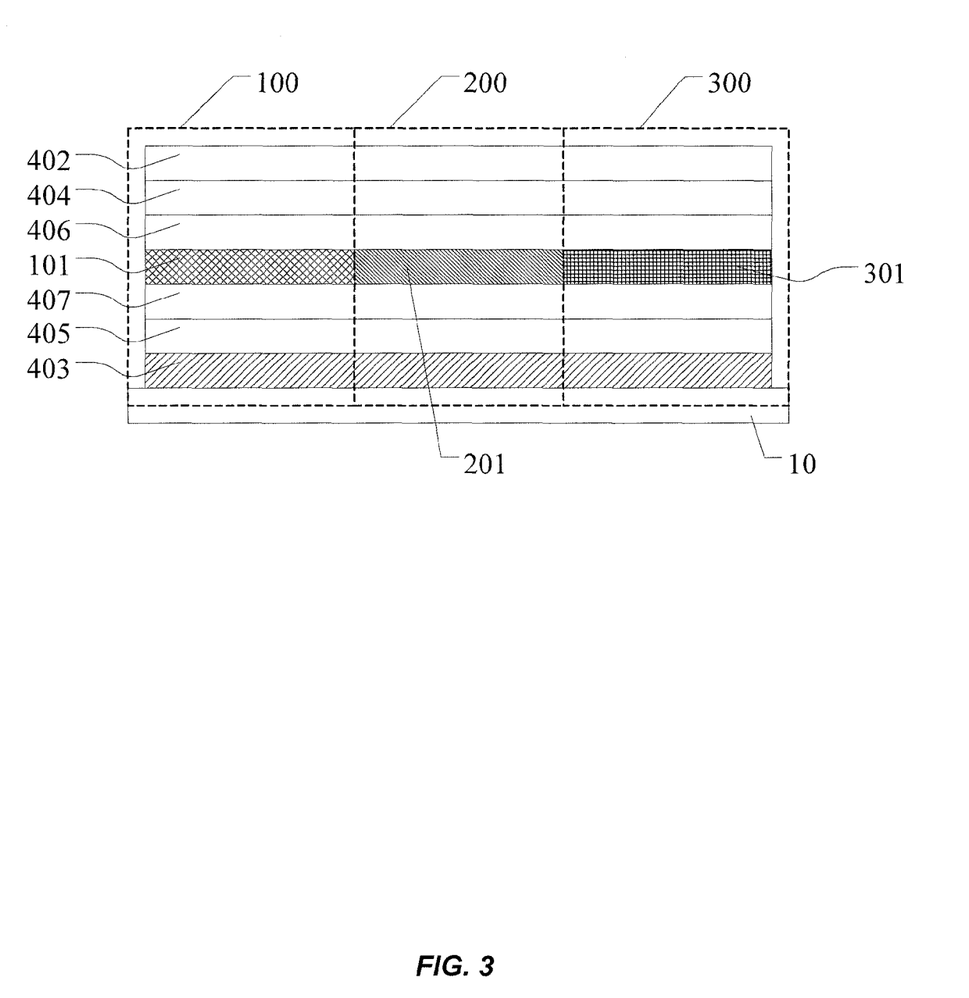
FIG. 3 is a schematic sectional view of a white organic light emitting device according to a preferred embodiment of the disclosure.

Conditions which should be satisfied by the structures of the light emitting units are respectively discussed above. In a case that the conditions are satisfied, the first light emitting unit 100, the second light emitting unit 200 and the third light emitting unit 300 may be made of different materials respectively. However, for convenience of process, the first light emitting unit 100, the second light emitting unit 200 and the third light emitting unit 300 may share a common anode. The first light emitting unit 100, the second light emitting unit 200 and the third light emitting unit 300 may share a common cathode. The hole injection layers of the first light emitting unit 100, the second light emitting unit 200 and the third light emitting unit 100 may be made of the same material. The hole transport layers of the light emitting units may be made of the same material. The electron injection layers of the light emitting units may be made of the same material. The electron transport layers of the light emitting units may be made of the same material. FIG. 3 is a schematic sectional view of a white organic light emitting device according to a preferred embodiment of the disclosure. Referring to FIG. 3, except light emitting elements, all other layers are shared among the first light emitting unit 100, the second light emitting unit 200 and the third light emitting unit 300. An anode 403, a hole injection layer 405, a hole transport layer 407, light emitting elements, an electron transport layer 406, an electron injection layer 404 and a cathode 402 are sequentially stacked on the substrate 10. The first light emitting element 101 is made of blue light emitting material different from yellow light emitting material used by the second light emitting element 201 and the third light emitting element 301. The second light emitting element 201 and the third light emitting element 301 are made of yellow light emitting material and the yellow light emitting material may be shared among the second light emitting element 201 and the third light emitting element 301. Since optical lengths of the optical microcavities of the light emitting units are different, material is shared among the layers of the light emitting units with the thicknesses of the layers being different, which is not shown in the FIG. 3.

An implementation is provided in the following according to the preferred embodiments of the disclosure.

The white organic light emitting device in the implementation includes an anode, a first hole injection layer, a second hole injection layer, a hole transport layer, a light emitting element, an electron transport layer, an electron injection layer and a cathode, which are sequentially stacked on a substrate. Anodes, first hole injection layers, hole transport layers, electron transport layers, electron injection layers and cathodes of the light emitting units are made of the same material and have the same thickness.

The anode includes a first ITO layer with a thickness of 15 nm, an Ag reflective layer with a thickness of 100 nm and a second ITO layer with a thickness of 15 nm, which are sequentially stacked.

The first hole injection layers are made of CuPc and have a thickness of 30 nm.

The hole transport layers are made of 4,4'-Cyclohexylidenebis[N,N-bis(4-methylphenyl) aniline] (TAPC) and have a thickness of 40 nm.

The electron transport layers are made of 2,9-dimethyl-4,7-diphenyl-1,10-phenanthroline (BCP) and have a thickness of 30 nm.

The electron injection layers are made of Liq(8-hydroxyquinolinato lithium) and have a thickness of 10 nm.

The cathodes are formed through co-evaporation of magnesium and silver and have a thickness of 15 nm.

The second hole injection layers of the light emitting units are made of 2,3,6,7,10,11-hexacyano-1,4,5,8,9,12-hexaazatriphenylene (HAT-CN), but have different thicknesses. The thickness of the second hole injection layer of the first light emitting unit is 60 nm, the thickness of the second hole injection layer of the second light emitting unit is 100 nm, and the thickness of the second hole injection layer of the third light emitting unit is 140 nm.

The first light emitting element of the first light emitting unit is made of 5% doped Firpic:mCP, i.e., Bis[2-(4,6-difluorophenyl)pyridinato-C2, N](picolinato) iridium(III): 1,3-Di-9-carbazolylbenzene, and has a thickness of 25 nm.

The second light emitting element of the second light emitting unit is made of 4% doped Ir(2-phq)2(acac):CBP, i.e., Tris(2-phenylquinoline-$C^2$, N')iridium(III): 4,4'-Bis(N-carbazolyl)-1,1'-biphenyl, and has a thickness of 30 nm.

The third light emitting element of the third light emitting unit is made of 4% doped Ir(2-phq)2(acac):CBP, i.e., Tris (2-phenylquinoline-$C^2$, N')iridium(III): 4,4'-Bis(N-carbazolyl)-1, 1'-biphenyl, and has a thickness is 40 nm.

For the white organic light emitting device in the implementation, a peak wavelength of light emission of the first light emitting unit is 460 nm, and light with the peak wavelength is blue light. A peak wavelength of light emission of the second light emitting unit is 550 nm, and light with the peak wavelength is green light. A peak wavelength of light emission of the third light emitting unit is 630 nm, and light with the peak wavelength is red light. Light of the three colors is mixed together on a light emergence surface of the white organic light emitting device to form white light.

The white organic light emitting device according to the disclosure is applicable to a lighting device. For the lighting device using the white organic light emitting device according to the embodiments of the disclosure, light emitting efficiency is high, stability is good, saturation of the emitted white light is good, and a range for adjusting color temperature is wide.

What is claimed is:

1. A white organic light emitting device, comprising:
a first light emitting unit, comprising a first light emitting element, wherein the first light emitting element comprises blue light emitting material;
a second light emitting unit, comprising a second light emitting element, wherein the second light emitting element comprises yellow light emitting material; and
a third light emitting unit, comprising a third light emitting element, wherein the third light emitting element comprises yellow light emitting material;
wherein the first light emitting unit, the second light emitting unit and the third light emitting unit are arranged in parallel,
wherein the first light emitting unit comprises a pair of a cathode and an anode and the first light emitting element is arranged therebetween; the second light emitting unit comprises a pair of a cathode and an anode and the second light emitting element is arranged therebetween; and the third light emitting unit comprises a pair of a cathode and an anode and the third light emitting element is arranged therebetween,
wherein a hole injection layer, a hole transport layer, an electron injection layer and an electron transport layer are between each pair of the anodes and the cathodes of the first light emitting unit, the second light emitting unit and the third light emitting unit,
wherein the anode of the first light emitting unit comprises a first ITO layer with a thickness of 15 nm, an Ag reflective layer with a thickness of 100 nm and a second ITO layer with a thickness of 15 nm, which are sequentially stacked;
the hole injection layer of the first light emitting unit comprises a first hole injection layer, which is made of CuPc and has a thickness of 30 nm, and a second hole injection layer, which is made of 2,3,6,7,10,11-hexacyano-1,4,5,8,9,12-hexaazatriphenylene (HAT-CN) and has a thickness of 60 nm, and the first hole injection layer and the second hole injection layer are sequentially stacked;
the hole transport layer of the first light emitting unit is made of 4,4'-Cyclohexylidenebis[N,N-bis(4-methylphenyl)aniline] (TAPC) and has a thickness of 40 nm;
the electron transport layer of the first light emitting unit is made of 2,9-dimethyl-4,7-diphenyl-1,10-phenanthroline (BCP) and has a thickness of 30 nm;
the electron injection layer of the first light emitting unit is made of Liq(8-hydroxy-quinolinato lithium) and has a thickness of 10 nm;
the cathode of the first light emitting unit is formed through co-evaporation of magnesium and silver and has a thickness of 15 nm; and
the first light emitting element of the first light emitting unit is made of 5% doped FIrpic:mCP which is Bis[2-(4,6-difluorophenyl)pyridinato-C2, N](picolinato) iridium(III): 1,3-Di-9-carbazolylbenzene, and has a thickness of 25 nm,
wherein the anode of the second light emitting unit comprises a first ITO layer with a thickness of 15 nm, an Ag reflective layer with a thickness of 100 nm and a second ITO layer with a thickness of 15 nm, which are sequentially stacked;
the hole injection layer of the second light emitting unit comprises a first hole injection layer, which is made of CuPc and has a thickness of 30 nm, and a second hole injection layer, which is made of 2,3,6,7,10,11-hexacyano-1,4,5,8,9,12-hexaazatriphenylene (HAT-CN) and has a thickness of 100 nm, and the first hole injection layer and the second hole injection layer are sequentially stacked;
the hole transport layer of the second light emitting unit is made of 4,4'-Cyclohexylidenebis[N,N-bis(4-methylphenyl) aniline] (TAPC) and has a thickness of 40 nm;
the electron transport layer of the second light emitting unit is made of 2,9-dimethyl-4,7-diphenyl-1,10-phenanthroline (BCP) and has a thickness of 30 nm;
the electron injection layer of the second light emitting unit is made of Liq(8-hydroxy-quinolinato lithium) and has a thickness of 10 nm;
the cathode of the second light emitting unit is formed through co-evaporation of magnesium and silver and has a thickness of 15 nm; and
the second light emitting element of the second light emitting unit is made of 4% doped Ir(2-phq)2(acac): CBP which is Tris(2-phenylquinoline-$C^2$, N')iridium (III): 4,4'-Bis(N-carbazolyl)-1,1'-biphenyl, and has a thickness of 30 nm, and
wherein the anode of the third light emitting unit comprises a first ITO layer with a thickness of 15 nm, an Ag reflective layer with a thickness of 100 nm and a second ITO layer with a thickness of 15 nm, which are sequentially stacked;
the hole injection layer of the third light emitting unit comprises a first hole injection layer, which is made of CuPc and has a thickness of 30 nm, and a second hole injection layer, which is made of 2,3,6,7,10,11-hexaacyano-1,4,5,8,9,12-hexaazatriphenylene (HAT-CN) and has a thickness of 140 nm, and the first hole injection layer and the second hole injection layer are sequentially stacked;

the hole transport layer of the third light emitting unit is made of 4,4'-Cyclohexylidenebis[N,N-bis(4-methylphenyl) aniline] (TAPC) and has a thickness of 40 nm;

the electron transport layer of the third light emitting unit is made of 2,9-dimethyl-4,7-diphenyl-1,10-phenanthroline (BCP) and has a thickness of 30 nm;

the electron injection layer of the third light emitting unit is made of Liq(8-hydroxy-quinolinato lithium) and has a thickness of 10 nm;

the cathode of the third light emitting unit is formed through co-evaporation of magnesium and silver and has a thickness of 15 nm; and the third light emitting element of the third light emitting unit is made of 4% doped Ir(2-phq)2(acac):CBP which is Tris(2-phenylquinoline-$C^2$, N')iridium (III): 4,4'-Bis(N-carbazolyl)-1,1'-biphenyl, and has a thickness is 40 nm.

2. The white organic light emitting device according to claim 1, wherein a peak position of an intrinsic emission spectrum of the blue light emitting material of the first light emitting element ranges from 430 nm to 480 nm, and a peak position of an intrinsic emission spectrum of the yellow light emitting material of the second light emitting element and a peak position of an intrinsic emission spectrum of the yellow light emitting material of the third light emitting element range from 560 nm to 600 nm.

3. The white organic light emitting device according to claim 2, wherein the yellow light emitting material of the second light emitting element is the same as the yellow light emitting material of the third light emitting element.

4. The white organic light emitting device according to claim 1, wherein each of the anodes of the first light emitting unit, the second light emitting unit and the third light emitting unit comprises a metal conductive layer, and each of the cathodes of the first light emitting unit, the second light emitting unit and the third light emitting unit comprises a transparent conductive layer.

5. The white organic light emitting device according to claim 1, wherein the first light emitting unit emits blue light, and a peak wavelength of the blue light emitted by the first light emitting unit ranges from 430 nm to 480 nm.

6. The white organic light emitting device according to claim 5, wherein an optical microcavity is formed between reflective surfaces of the anode and the cathode of the first light emitting unit, and the optical microcavity of the first light emitting unit satisfies the following formula:

$$\sum_i n_{Bi} d_{Bi} = \frac{\lambda_B}{2} m_B$$

wherein $n_{Bi}$ is a refractive index of an ith layer in the optical microcavity of the first light emitting unit, $d_{Bi}$ is a thickness of the ith layer in the optical microcavity of the first light emitting unit, $\lambda_B$ is a wavelength of the blue light predetermined to be emitted by the first light emitting unit, and $m_B$ is a modulus of the optical microcavity of the first light emitting unit, which is a positive integer.

7. The white organic light emitting device according to claim 1, wherein a spectrum of yellow light emitted by the second light emitting element of the second light emitting unit has a blue shift, the second light emitting unit emits green light, and a peak wavelength of the green light emitted by the second light emitting unit ranges from 500 nm to 560 nm.

8. The white organic light emitting device according to claim 7, wherein an optical microcavity is formed between reflective surfaces of the anode and the cathode of the second light emitting unit, and the optical microcavity satisfies following formula:

$$\sum_i n_{Gi} d_{Gi} = \frac{\lambda_G}{2} m_G$$

wherein $n_{Gi}$ is a refractive index of an ith layer in the optical microcavity of the second light emitting unit, $d_{Gi}$ is a thickness of the ith layer in the optical microcavity of the second light emitting unit, $\lambda_G$ is a wavelength of the green light predetermined to be emitted by the second light emitting unit, and $m_G$ is a modulus of the optical microcavity of the second light emitting unit, which is a positive integer.

9. The white organic light emitting device according to claim 1, wherein a spectrum of yellow light emitted by the third light emitting element of the third light emitting unit has a red shift, the third light emitting unit emits red light, and a peak wavelength of the red light emitted by the third light emitting unit ranges from 600 nm to 650 nm.

10. The white organic light emitting device according to claim 9, wherein an optical microcavity is formed between reflective surfaces of the anode and the cathode of the third light emitting unit, and the optical microcavity satisfies following formula:

$$\sum_i n_{Ri} d_{Ri} = \frac{\lambda_R}{2} m_R$$

wherein $n_{Ri}$ is a refractive index of an ith layer in the optical microcavity of the third light emitting unit, $d_{Ri}$ is a thickness of the ith layer in the optical microcavity of the third light emitting unit, $\lambda_R$ is a wavelength of the red light predetermined to be emitted by the third light emitting unit, and $m_R$ is a modulus of the optical microcavity of the third light emitting unit, which is a positive integer.

* * * * *